United States Patent [19]

Baer et al.

[11] Patent Number: 4,684,055
[45] Date of Patent: Aug. 4, 1987

[54] METHOD OF SELECTIVELY SOLDERING THE UNDERSIDE OF A SUBSTRATE HAVING LEADS

[75] Inventors: Scott D. Baer, Indialantic, Fla.; Thomas P. Glenn, Modesto, Calif.

[73] Assignee: Harris Corporation, Melbourne, Fla.

[21] Appl. No.: 771,846

[22] Filed: Sep. 9, 1985

[51] Int. Cl.⁴ .............................................. B23K 31/02
[52] U.S. Cl. ................................ 228/180.1; 427/96; 228/254; 228/56.3
[58] Field of Search ...................... 228/254, 56.3, 248, 228/180.1, 180.2; 427/96

[56] References Cited

U.S. PATENT DOCUMENTS 3,726,007 4/1973 Keller .
3,950,200 4/1976 Muramoto et al. .................... 427/96
4,304,640 12/1981 Walker .
4,327,124 4/1982 Des Marais ..................... 228/180.1
4,332,341 6/1982 Minetti .
4,339,784 7/1982 Shearer .
4,442,966 4/1984 Jourdain et al. ................. 228/180.2

Primary Examiner—Nicholas P. Godici
Assistant Examiner—Karen Skillman
Attorney, Agent, or Firm—Barnes & Thornburg

[57] ABSTRACT

A method for soldering the underside of a substrate between leads. A paste of solder emulsified in a flux material is printed onto a carrier and film. The paste is adhered to the film by drying or reflowing before being placed onto the substrate between the projecting leads. The substrate and film are then heated. The molten solder having an affinity for plated surface areas of the substrate and no affinity for the polyimide film transfers and self-aligns to the plated surfaces of the substrate. The method allows selective soldering of the underside surface of a substrate having leads without soldering these leads, or selective soldering of some plated areas of a substrate while leaving other plated areas free of solder.

10 Claims, 6 Drawing Figures

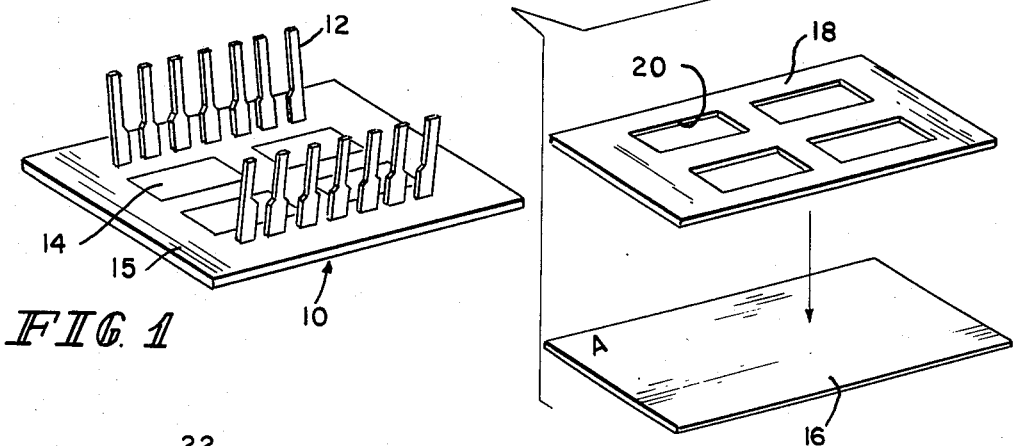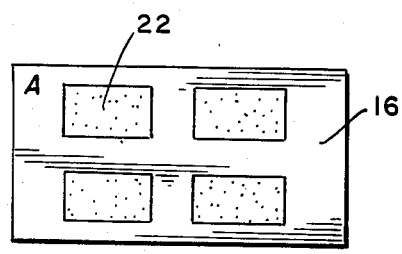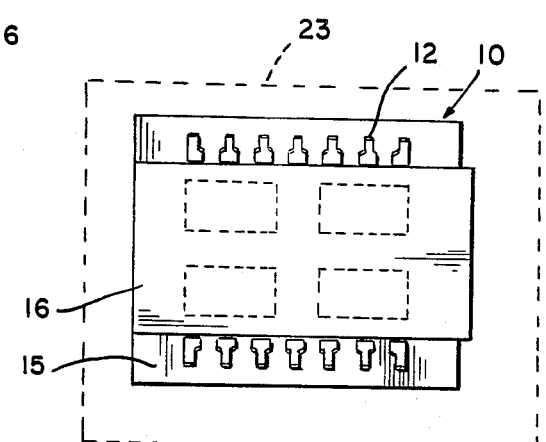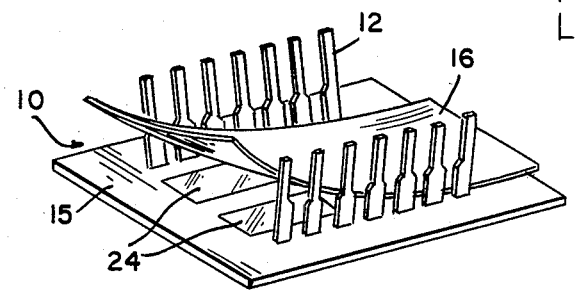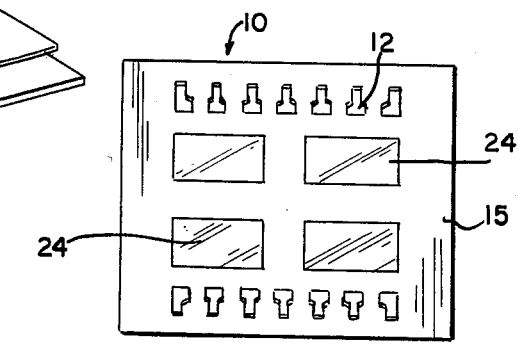

METHOD OF SELECTIVELY SOLDERING THE UNDERSIDE OF A SUBSTRATE HAVING LEADS

BACKGROUND AND SUMMARY OF THE INVENTION

The present invention relates generally to soldering substrates, and more specifically to applying solder to the underside of leaded substrates.

Often, printed circuit board structures are soldered by automated techniques such as wave soldering. Solder bridging between leads is a problem in these processes. U.S. Pat. No. 4,339,784 addresses this problem when soldering leads to a circuit board by providing foil pads to draw off excess solder to avoid bridging between leads. However, this process does not allow selective placement of solder on the substrate to avoid coating leads with solder. Oil has been used to avoid bridging but requires post-soldering clean-up and does not prevent soldering of the leads.

U.S. Pat. No. 4,304,640 shows the use of a mask to selectively solder the surface of a circuit board. In this process, first a continuous conductive surface is formed on a board. Next, a mask is formed on the surface to leave predetermined exposed areas. Solder is electroplated onto these areas, and the mask and remaining conductive surface are removed. This patent uses a leadless substrate and, thus, does not address problem of solder bridging between leads or the prevention of solder coating leads. Masking leads would be a difficult and time-consuming step. Also, exact alignment of the mask is required because only the unmasked areas will be soldered.

U.S. Pat. No. 4,332,341 shows the bonding of solid solder preforms to selected areas of a substrate before melting. Selective placement is accomplished with a vacuum applicator and transfer occurs with pressure and heat. Exact alignment is necessary because the solder is transferred at a temperature below its melting point, therefore it will not self-align on transfer. In addition, the apparatus could not be used on the face of a substrate with leads as the vacuum applicator is flat and covers the entire substrate. The problem with the present soldering methods is soldering the underside of a substrate having leads without soldering the leads.

Thus, it is an object of the present invention to provide a process for soldering the underside of a substrate having leads.

It is another object of the present invention to provide a process for soldering in between the leads of a substrate without soldering across the leads.

It is another object of present invention to provide a process for selectively soldering areas of a substrate in between the leads of a substrate while leaving other areas free of solder.

These objects are achieved in accordance with a preferred embodiment of the present invention by a method using a solder carrier having a solder pattern adhered thereto by heat to solder the plated areas of a substrate. Solder paste on one side of a solder carrier is applied to a substrate with that solder side facing the substrate. The substrate, solder and solder carrier are heated to transfer the solder to the plated areas of the substrate at a temperature sufficient to allow self-alignment.

Other objects, advantages and novel features of the present invention will become apparent from the following detailed description of the invention when considered in conjunction with the accompanying drawings.

BRIEF DESCRIPTION OF THE DRAWINGS

FIG. 1 is a perspective view of the underside of a substrate prior to soldering.

FIG. 2 illustrates the film carrier and screen or stencil.

FIG. 3 illustrates the film carrier with solder paste after printing.

FIG. 4 illustrates the heating of the substrate with the film carrier applied.

FIG. 5 illustrates the removal of the film carrier.

FIG. 6 is a view of the soldered underside of a substrate.

DETAILED DESCRIPTION OF THE DRAWINGS

FIG. 1 illustrates the underside of a substrate 10 with leads 12, before soldering, having plated areas 14 and the remainder of the surface non-metallized 15. FIG. 2 illustrates a solder carrier film 16 which may be polyimide of approximately 0.010 inches to 0.030 inches thick and a screen or stencil 18 with holes 20 for printing the solder paste onto the film 16. The film 16 has a width 0.005 inches to 0.010 inches less than the width between rows of leads 12. The solder paste of solder emulsified in a flux material is screen printed onto the film 16 through the holes 20 in screen 18. The preferred embodiment of this paste comprises a mixture of solder particles (60% tin and 40% lead) in a flux and solvent vehicle. The solder particles must be consistent in size and shape. The design of the screen or stencil 18 has holes 20 in areas which coincide with the metallized areas 14 on the substrate 10. After printing, the film 16 has solder paste areas 22 on side A (FIG. 3), having a thickness in the range of 0.001 inches to 0.015 inches. The film carrier has a minimum width of 0.010 inches to 0.020 inches between the outside edge of the film adjacent to leads 12 and the outer edge of the solder area 22. This insures that the solder will not bridge over to the leads 12, even with minor mispositioning of the film carrier on the substrate. The paste is adhered to the film 16 by drying or possibly reflowing.

The film 16 is then placed with the solder areas 22 (side A) facing down onto the substrate 10 between the leads 12 (FIG. 4). The film 16 is entirely between the rows of leads and the outside edges either touching the leads or are spaced by 0.005 inches to 0.010 inches from leads 12. Solder areas 22 are aligned over plated areas 14 of substrate 10. Exact alignment is not necessary as will be described below. The substrate 10 and film 16 are then passed through a vapor phase, IR furnace or other heating apparatus. The preferred temperature of heating is in the range of 190° to 200° C.

On heating to a temperature to cause the solder to melt, the melted solder areas 22 have an affinity for the plated area 14 and no affinity for the film 16 or non-metallized area 15 on the substrate 10. Thus, the solder areas 22 will self-align on the plated areas 14 and transfer from the film 16 onto the substrate plated areas 14. The film 16 can then be removed (FIG. 5) leaving the substrate with soldered areas 24 and leaving the rest of the non-metallized surface 15 and leads 12 unsoldered (FIG. 6).

Using this method, the underside of a substrate in between the leads may be soldered without bridging between leads, eliminating the problem of a short circuit. In addition, the leads can be plated with other preferred materials such as gold rather than the solder coated leads required by currently used processes. Finally, selective soldering of plated areas of a substrate is achieved, and exact alignment of solder areas of the film carrier onto the plated areas of the substrate is not required.

Although the method is described for soldering the underside of a substrate in between leads, this method can be used to selectively solder areas of any surface including an electronic component. Also the method described may be used to selectively solder some plated areas of a substrate while leaving other plated areas free of solder. Also, the illustration is not to be taken as a limitation as to dimensions, temperatures of heating or composition of solder paste.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. The method of applying solder to metallic areas of a substrate comprising:

placing a solder carrier having solder paste adhered to said carrier on one surface onto a substrate surface in predetermined areas having metallic and non-metallic areas, wherein said solder paste surface of said carrier faces said substrate surface and said paste areas substantially coincide with said metallic areas;

heating said solder carrier and substrate to transfer said solder to said metallic areas; and remove said carrier from said substrate.

2. The method of claim 1, wherein said solder paste is a suspension of solder in a flux material.

3. The method of claim 2, including depositing said solder paste onto said solder carrier and drying said paste thereon.

4. The method of claim 2, including depositing said solder paste onto said solder carrier and reflowing said paste thereon.

5. The method of claim 1, wherein said solder carrier is a film.

6. The method of claim 5, wherein said film is polyimide.

7. The method of claim 5, wherein said solder paste is printed onto said film.

8. The method of claim 7, wherein said solder printing matches the metallic areas to be soldered of said substrate.

9. The method of claim 1, wherein said substrate surface has leads.

10. The method of claim 9, wherein said film is placed entirely in between the leads and wherein said film has a width less than the distance between said leads.

* * * * *